(12) United States Patent
Tonks

(10) Patent No.: US 6,415,412 B2
(45) Date of Patent: Jul. 2, 2002

(54) SIGNAL USED IN THE TRANSMISSION OF DATA IN A COMMUNICATION SYSTEM

(75) Inventor: David John Tonks, Sigriswil (CH)

(73) Assignee: Ascom Tech AG, Bern (CH)

( * ) Notice: Subject to any disclaimer, the term of this patent is extended or adjusted under 35 U.S.C. 154(b) by 0 days.

(21) Appl. No.: 09/835,352

(22) Filed: Apr. 17, 2001

Related U.S. Application Data

(62) Division of application No. 08/985,634, filed on Dec. 4, 1997, now Pat. No. 6,243,844.

(30) Foreign Application Priority Data

Jan. 17, 1997 (CH) ............................................... 0090/97
Jan. 24, 1997 (CH) ............................................... 0155/97

(51) Int. Cl.$^7$ ............................................ H03M 13/00
(52) U.S. Cl. ........................................ 714/775; 714/701
(58) Field of Search ................................. 714/701, 752, 714/775, 776, 800, 779, 712; 370/902, 241, 242, 912, 216, 218

(56) References Cited

U.S. PATENT DOCUMENTS 5,526,368 A * 6/1996 Yun ............................ 714/775
5,983,386 A * 11/1999 Nakano et al. ............. 714/757
6,243,844 B1 * 6/2001 Tonks .......................... 714/758

* cited by examiner

Primary Examiner—Christine T. Tu
(74) Attorney, Agent, or Firm—Birch, Stewart, Kolasch & Birch, LLP

(57) ABSTRACT

A signal used in the transmission of data in a communication system (for example in an ATM network), comprised of immediately successive cells. For the purpose of cell synchronization, filler cells (I) containing a predefined bit pattern are provided. This pattern is provided with an error protection code that differs from the error protection code used for the user data. Even if the user data should coincidentally contain the predefined bit pattern, the synchronization circuit will not be able to be simulated, since this false bit pattern is provided with a different error protection code. In order to test and ensure the synchronization state, a BIP value at the end of the cell is checked at the receiver end.

11 Claims, 3 Drawing Sheets

SIGNAL USED IN THE TRANSMISSION OF DATA IN A COMMUNICATION SYSTEM

This application is a divisional of co-pending application Ser. No. 08/985,634, filed on Dec. 4, 1997 now U.S. Pat. No. 6,243,844, the entire contents of which are hereby incorporated by reference and for which priority is claimed under 35 U.S.C. §120; and this application claims priority of Application No. 0090/97 and 0155/97 filed in Switzerland on Jan. 17, 1997 and Jan. 24, 1997, respectively, under 35 U.S.C. §119.

FIELD OF THE INVENTION

The invention relates to a signal used in the transmission of data in a communication system, wherein the signal is comprised of continuous, successive cells. The invention further relates to a method for synchronizing a receiver relative to the cells of such a signal, a method for generating the above-named signal, and transmitting and receiving circuits used to implement this method.

BACKGROUND OF THE INVENTION

In packet-oriented data transmission, such as, for example, in an ATM system (ATM=asynchronous transfer mode), the receiver must recognize (in English, packet delineation) the start time of the incoming packets (also called cells). The quality of this synchronization significantly affects the overall performance of the system. A poor "packet delineation" increases proportionately the number of data packets that are lost, and can thereby, for example, destroy the performance of other processing steps.

Cell synchronization should—first of all—be as immune as possible to bit errors and bit patterns that may be present within the transmitted data (so-called mimics: random patterns that simulate a synchronization pattern) and will lead to synchronization error. Second, in the case of a synchronization error, the receiver should be capable of extricating itself from this situation independently. Third, and finally, it should be possible to implement the method at the lowest possible cost in terms of hardware. Generally, the cost in terms of hardware increases proportionally to reliability requirements. To this extent, then, the first two requirements stand in direct contrast to the third requirement.

In communication systems (especially in networks having several nodes), in addition to the user data, monitoring and control data usually must also be transmitted. The monitoring data may be based upon the user data or some given system conditions.

The system user is interested primarily in having his data transmitted at the highest possible speed. It would thus be to his benefit to have the largest possible band width at his disposal. For physical reasons, or due to standardized requirements, however, the overall band width that is available is limited. The transmission of control data can thus result in a necessary reduction in the band width available for user data. In order to leave the largest possible band width available to the user, the monitoring and/or control data should be transmitted as efficiently as possible.

SUMMARY

It is the object of the invention to provide a signal of the type described above such that a high probability of synchronization is ensured and synchronization errors can be detected within a short period of time. In addition, it is the object to process the signal at little cost in terms of circuit engineering.

In accordance with one embodiment of the invention, at least some of the transmitted packets or cells contain a predefined bit pattern, which is recognized by the receiver and which permits the detection of the cell boundaries. In order to prevent the receiver from mistakenly synchronizing itself to a bit pattern that may be contained in the (randomly variable) data stream from the user, the communication system, at the transmitter end, provides the synchronization bit pattern with a specific error protection code. This error protection code differs from the code that is used to protect the user data.

Recognition of a predefined bit pattern is relatively simple and quick. This is important for communication systems having high data transmission rates. If the sequence of the data bits to be transmitted by the user should coincidentally be identical to the predefined synchronization pattern (mimic), this will necessarily result in a different error protection code. If the synchronization pattern and its error protection code are regarded as a single unit, then the invention will ensure (with very high probability) that this unit cannot be simulated by the user.

The predefined bit pattern should be of a certain length, so that the probability that precisely this bit sequence will occur in the data from the user is very slight. It will typically have a length of several bytes. Due to the encoding specified in the invention, it is not necessary for the length to be greater than 20 bytes. In the exemplary embodiment described in detail below, for example, this length is 10 bytes.

Preferably, both the predefined bit pattern and the user data are provided with a parity code. In accordance with the invention, however, various polarity patterns are used. If, for example, the polarity pattern of the user data alternates even and odd, then that bit pattern may have several equal polarities one after another.

Of course it is also possible for the predefined bit pattern on the one hand and the user data on the other hand to be processed with totally different encoding procedures. What is important here is that the probability is infinitesimal, if not zero, that a coincidentally identical bit pattern in the user data would result in the same error protection code.

It naturally remains a possibility that a mimic may be produced as a result of a certain error combination in transmission. In order for the receiver to be able to recognize an error in synchronization, the transmitted cells are also provided with a block code, at a predetermined position, which essentially encodes the payload region of the cell. In the case of a synchronization error, the receiver naturally interprets any byte as a block code, so that, as a result, the bit error rate will lie far above the average bit error rate for the system.

A particularly simple and effective encoding is presented by bit interleaved parity encoding. In this, in principle, all bytes of the cell are encoded in columns. The BIP value (BIP=bit interleaved parity) is positioned, for example, at the end of the cells. It can be advantageous for the BIP value not to encode all of the bytes of the cell. According to a preferred embodiment of the invention, for example, one report byte is not encoded in the BIP value. This byte can then be changed from cell to cell in order, for example, to permit recognition of a so-called "slip." (In a "slip" the receiver misses individual time cycles for one reason or another. The report byte makes it possible to recognize a "slip" even when the user data, for example, contain a series of zeros).

In accordance with one preferred embodiment of the invention, the predefined bit pattern is transmitted not in those cells that contain the user data, but rather in separate filler cells. These are always transmitted when no user data are present, but, also when the capacity of the transmission link has been exceeded. In each case, these filler cells should be present in the data stream at a frequency rate of at least 0.1%. If—viewed statistically—fewer filler cells are present, then the synchronization time will be disproportionately high (because the synchronization bit pattern will appear too infrequently). Advantageously, the statistical frequency lies within a range of 1%.

Naturally, the synchronization bit pattern should not be transmitted more frequently than necessary. If it were present in more than 10% of the cells, then the effects on transmission capacity would be noticeable.

It is advantageous for the length of the cells to be firmly predetermined (for example 53 bytes). It is, however, entirely possible to work with cells of varying lengths. Obviously, some indication of the length of the given cell must then be provided somewhere in the cell header.

In the simplest case, filler cells and data lines are equal in length and of basically the same format (for example 5 bytes header, 48 bytes payload). The predefined bit pattern is then positioned in the header of the filler cells, and the BIP value is at the end of each data line. In principle it remains possible for the synchronization bit pattern to be contained in the header of a data cell. With relatively small cells (such as are typically found in ATM systems), however, this would take up space that should be left open for other information.

In certain system configurations (for example when the format of the header is not firmly fixed) it is possible for data cells to become confused with filler cells, resulting in their erroneous elimination by the receiver, without their content being examined. In order to prevent this, a different error protection code (for example a different, specifically an inverse, parity polarity pattern) may be used. This permits the parity demodulator on the receiver end to differentiate between filler cells and data cells. It can then properly drive the subsequent multiplexer, which segregates the filler cells.

The signal specified in the invention is carefully designed such that the receiver-end circuit, or the method of packet synchronization, is very simple. In the transmitter, the predefined bit pattern is stored (or programmed in), together with the proper error protection code, as a single coherent bit sequence. For packet synchronization, it is necessary only to search the affected data stream for the above-named bit sequence. When it is found, the synchronization is considered successful (or it is assumed it is successful).

In principle, two circuit components are to be used at the receiver end, between which changeovers can be made as necessary. One of the circuit components (search circuit) serves to search for and recognize the bit pattern to permit detection of the packet boundaries (function "hunt state"). The other ("sync-state" circuit component) determines the current bit error rate and initiates a restart when a boundary has been crossed. The above-named circuit components can be programmed into the hardware or into the software.

In order to ensure that no synchronization error is present (or that the synchronization will later be lost without this being noticed), at the end of each cell the block codes (for example the BIP values) are checked, quasi in the "tracking mode." If the error rate lies within the range of the system error rate (this s is known because they are statistically measurable), then a proper synchronization is assumed. If, in contrast, the error rate is very high (for example more than 10%), then a new synchronization is implemented. (The system error rate for the communication systems referred to here typically lie far below 10'3.)

Before a decision is made regarding a restart, several cells are checked . Only when the error rate exceeds a certain value is a synchroniza tion error assumed. The above-named value maybe firmly pre-established or may be variable. In other words, a statistical analysis of the system error rate can be implemented online (for example, by taking measurements every few minutes).

At the receiver end, costs are minimal at any rate. The filler cells can be stored in a memory unit (such as a ROM) as a completed bit sequence, from which they are read out when needed. Thus, with this embodiment of the invention it is no longer necessary to generate the error protection code for the predefined bit sequence online.

In addition, the data lines that are sent are counted, to permit the filler cells to be interspersed into the data stream with the desired frequency.

In accordance with one particularly preferred embodiment of the invention, it is assumed that an initial data stream is encoded with parity bits. For the transmission of a second data stream (especially control data and similar streams), a polarity of the parity bit is modulated.

In principle, this independent, inventive idea is based upon the assumption that a stream of user data is already being transmitted that, is protected by parity bits against error. In accordance with the invention, the parity bits are now used for the transmission of additional data (control data, monitoring data, system parameters, etc.), via a modulation of the polarity pattern. Since the parity bits are present in any case, no additional band widths are required by the modulation of the polarity. In principle, then, with a predetermined band width, the band width efficiency is improved.

The modulation typically involves the combination of several successive parity bits into a single group, after which they are modulated as a block.

In a data packet, for example, a pre-defined sequence of parity polarities can be provided, that are intermittently or temporarily inverted when, for example, a "1" is to be transmitted in place of a "0".

In addition, at least two different polarity patterns can be used selectively by the transmitter to transmit either a "0" or a "1." It is clear that the data rate of the control data must be much lower than that of the user data. (If this condition is not fulfilled, then an independent transmission channel will be required.)

The groups will preferably have an uneven number of parity bits (for example, three). For the transmission of a "0", for example, the polarity pattern EVEN-ODD-EVEN is used, and for the transmission of a "1" the pattern ODD-EVEN-ODD is used. The uneven number of parity bits permits a so-called majority decision at the receiver end. That is, only the number of even and uneven parities must be counted to determine whether a "0" or a "1" has been sent. Of course, even in the case of an even number of parity bits per group, polarity patterns may be selected that will permit a majority decision (for example, EVEN-EVEN-ODD-EVEN rather than ODD-ODD-ODD-EVEN). In that case, however, the polarities EVEN and ODD may not be evenly distributed, or may be less evenly distributed.

Preferably, both parity polarities are represented within a group. In this manner, the probability of a long sequence having equal bits in the transmitted data stream can be minimized.

In principle it remains a possibility that the system would make the channel specified in the invention open to the user. Care must be taken to ensure that although the above-named supplementary channel "rides" the user data, it is nevertheless independent of it. The system can transmit its own control data, without the user taking notice of it, let alone being able to manipulate anything.

The data transmission method specified in the invention is particularly well suited for ATM systems (ATM= asynchronous transfer mode). Naturally it is suitable for application in any situation in which data are protected by a code against transmission errors.

In the following detailed description, and in the entirety of the patent claims, further advantageous embodiments and combinations of characterizing features of the invention are revealed.

DESCRIPTION OF THE PREFERRED EMBODIMENTS

Figure 1:
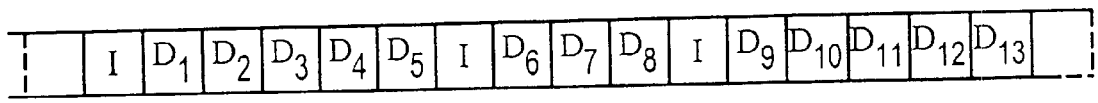
FIG. 1 an exemplary representation of the cellular composition of a signal as specified in one embodiment of the invention.
Figure 5:
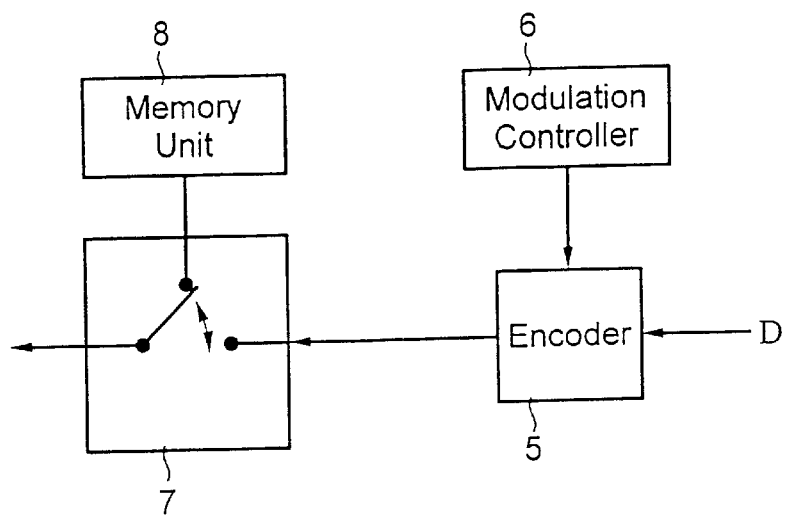
FIG. 5 depicts a block diagram illustrating signal generation at the transmitter end.

In an ATM system the data are transmitted in packets, wherein the packets (or cells) follow one another in continuous succession. FIG. 1 illustrates the composition of a signal as specified by one embodiment of the invention.

So-called filler cells I are inserted between the data packets D1 D13. In a manner that is known in the art, these can signal a data-free interval (in other words, whenever the FIFO [first-in first-out] memory for the user data is empty, a filler cell is inserted into the data stream). In the framework of this embodiment of the invention, however, they are also inserted at more or less regular intervals (in other words, not only when the transmitter is in an idle state), and in such a way that, when observed over a longer period of time, the filler cells I occur with a certain minimum frequency. This is because, due to the fact that the filler cells I contain the bit pattern, cell synchronization ("packet delineation") is enabled in the receiver.

It has been found that a frequency of 1% produces positive results. The less frequently the filler cells I occur, the greater the average synchronization time. If, however, they occur too frequently, then the transmission capacity for the user data is unnecessarily reduced.

Figure 2:
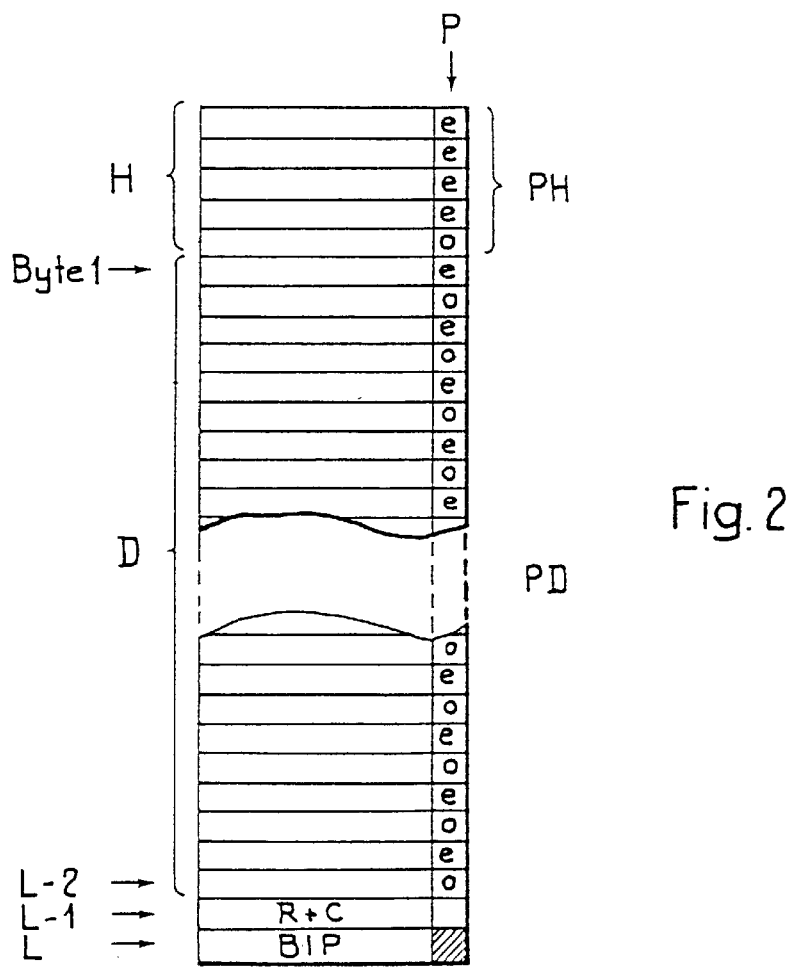
FIG. 2 depicts an exemplary representation of a cell.

FIG. 2 illustrates the pre-defined format of the filler cells I. This format begins with a header H, which has a bit pattern of, for example, 40 bits (for example "00 00 00 01 52"), which are supplemented with one parity-bit per byte. The sequence is firmly predefined, and forms, together with the parity bits, the actual synchronization sequence.

This is followed by a so-called data set D, which in the case of a filler cell is always empty. (With the data packets, the header H may contain variable system data, while the data set D is used to transport the user data.)

At the end of the cell, in other words at the position L−1, a so-called report and control byte "R+C byte", may be contained. This is input by the communication system in the transmission of the data, and changes from cell to cell, in order to permit recognition, for example, of a so-called "slip" error. In the final position, that is, at the position L, a BIP byte is positioned. This encodes the payload data (that is, the header H and the data set D) in accordance with the known-in-the-art bit interleaved parity principle. In this principle, the bits lying in the same column are parity encoded.

The header H and the data set D are protected against transmission errors by parity bits PH or PD (column P in FIG. 2). The parity polarity pattern of the header H is not the same as that of the data set D. The first five bytes of the header H are encoded, for example, with the polarity pattern EVEN-EVEN-EVEN-EVEN-ODD, while the data set D, for example, contains an alternating polarity pattern EVEN-ODD-EVEN-ODD- . . .

Filler cells and data cells have the same distribution in the header and the data set. In accordance with one preferred embodiment of the invention, however, the header of the filler cells is provided with a polarity pattern that is inverse to that of the header of the data cells. This serves to ensure that at the receiver end, a reliable differentiation can be made between the two cell types, even when the format of the header and its contents are selected by the user.

To determine the cell boundaries the receiver will search in the appropriate data stream for the above-named bit sequence contained in the header H. When it has found the sequence, then it will assume proper synchronization.

If no transmission errors occur, it is not possible for the user data to simulate the synchronization sequence. The parity polarity pattern calculated by the communication system, under the above-named circumstances, will be completely different. The probability of the encoding specified in the invention being simulated by transmission errors is infinitesimally small (nominally, with the low error rates usually found in ATM networks, on a magnitude of 10−6).

If a synchronization error should nevertheless occur, or if the synchronization should be lost due to some other reason, this can be recognized by the receiver via a check of the BIP value at the end of the cells. In the case of a packet synchronization error, the bit error rate will jump to a very high value (typically to approximately 50%), which will stand out against the average system error rate (which generally lies well below $10^{-[illegible]}$, for example in the range of $10^{-4}$) by several orders of magnitude.

Figure 3:
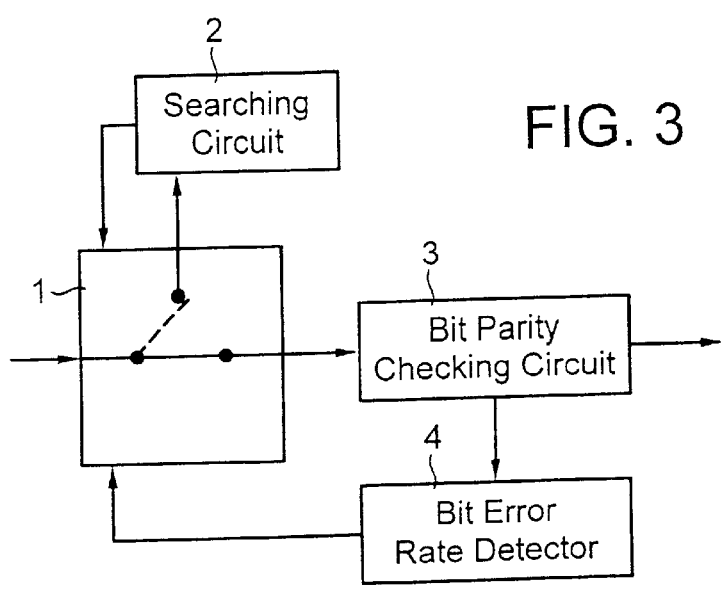
FIG. 3 depicts a block diagram illustrating the synchronization at the receiver end.

In short, the, synchronization process specified in the invention runs as follows as is depicted in FIG. 3.

For the synchronization of the receiver, the data are sent through a circuit 1 to a searching circuit 2. This circuit compares the data stream with a stored bit pattern. When the searched-for bit pattern is detected, the circuit 1 is reset so that the data stream will now be sent to the bit parity checking circuit 3. This circuit checks the BIP value (whereby the transmitted user data are sent for further processing in circuit components that are not illustrated here). Whenever an error is detected, the bit error rate detector 4 is signaled. This detector determines the bit error rate within several successive packets and compares them with a predefined system value (for example BER=1.0×10E-6). If the bit error rate is substantially higher than the system value, then a synchronization error is assumed. The circuit 1 is shifted back to the searching circuit 2, in order to implement a resynchronization.

The transmitter circuit is relatively simple in design. The user data D are parity coded in the encoder 5, based upon a predefined polarity pattern. The above-named polarity pattern is predefined by the modulation control 6. The circuit 7 that follows the encoder 5 is switched over from time to time to the memory unit 8, to permit transmission of the synchronization sequence specified in the invention. In accordance with the particularly preferred embodiment of the invention, the memory unit 8 contains the filler cells as a predefined bit sequence.

Figure 4:
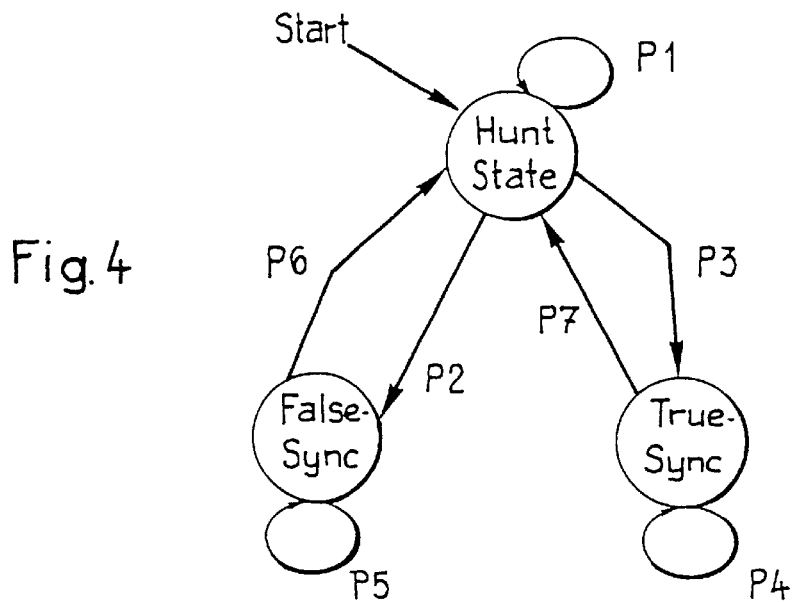
FIG. 4 depicts a representation of the possible system states.

As can be seen in FIG. 4, there are 3 system states: "Hunt state," "false-sync," and "true-sync." The arrows indicate the possible changes in state, and their probabilities.

p1: Probability of missing the packet synchronization bit pattern p2: probability of detecting a bit pattern error as a packet synchronization bit pattern p3: probability of recognizing a packet synchronization bit pattern p4: probability of remaining in the proper synchronization state p5: probability of remaining in a synchronization error state for more than n monitoring periods p6: probability of returning to the search mode within n monitoring periods p7: probability of entering the search mode ("hunt state") within the MTBSR (MTBSR=mean time between spurious realignments)

When the receiver spends too much time in the "false-sync" state, the performance of the data circuit is substantially damaged. For this reason it is important for this dwell time to be minimized. Thus p2 and p5 should be reduced.

The minimization of p2 is achieved via the varying parity encoding of synchronization bit patterns and user data. This is thus a measure implemented at the transmitting end. In the minimization of p5, care must be taken to ensure that p7 is not increased.

The probability lines p5 and p7 arise from the necessity of recognizing the "false-sync" state. There must thus be a balance between a mistaken departure from the "true-sync" state and a rapid recognition of the "false-sync" state. In order to permit detection of the "false-sync" state, the received bit parities—as already mentioned—are compared with those calculated in the receiver. In the "true-sync" state, bit errors can lead to differences that will simulate a synchronization error.

In order to achieve a packet synchronization within 1 s in the model illustrated in FIG. 4, enough filler cells must be contained in the packet stream, and the probabilities p1 and p2 must be minimal. The probability p2 is minimized in that the header H always has a different parity polarity pattern than the data set D. Thus, a synchronization error is possible only in the case of a high bit error rate. The smallest possible number of bit errors needed to generate a filler cell packet header is 2. In order for this to happen, a bit sequence must be present that will correspond to the bit pattern being sought, and that already has an even parity in the 1s', 3'd, and 5t' bytes.

The embodiment of the invention described below permits the efficient transmission of an additional data stream. It is not dependent upon the characterizing features of the above-described examples, and for this reason will be represented below as an independent invention.

Figures 6, 7:
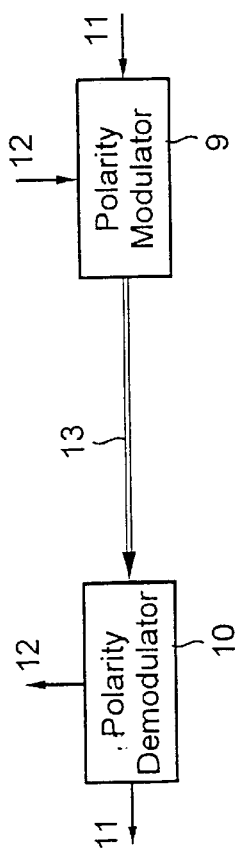
FIG. 6 depicts a schematic representation of a transmission system as specified in the invention.
FIG. 7 depicts a schematic representation of a data packet with a polarity pattern as specified in one embodiment of the invention.

As can be seen from FIG. 6, at the transmitter end the user data 11 and the control data 12 are sent to a polarity modulator 9. This modulator generates the parity bits corresponding to a predetermined polarity pattern, taking into account the control data 12. The data stream protected against errors in this manner is transmitted via the transmission link 13 (for example an electrical or optical line) to the receiver (for example, a further node in the network). The polarity demodulator 10 at the receiver end checks the parity bits and simultaneously extracts the control data 12.

FIG. 7 shows an example of a data packet with bit parity modulation. The data packet typically begins with a header H, which serves, for example, in packet synchronization (packet delineation), and can also contain information on the format (for example the length) of the packet. The corresponding bytes b1–b5 are protected by parity bits P1–P5. In accordance with one preferred embodiment of the invention, the parity bits P1–PS have a different polarity pattern from the subsequent bits. In the above example the pattern EVEN-EVEN-EVENEVEN-ODD was selected for the header H. This makes it possible to easily recognize the header of a new data packet.

The data set D follows the header H with the bytes b6, . . . , which also are protected with parity bits P6 . . . The polarities of the parities alternate continuously, to the extent that no modulation occurs. In other words, the bytes b6 . . . are encoded with EVEN, ODD, EVEN, ODD . . . parities.

In accordance with a particularly preferred embodiment of the invention, three successive bytes at a time, b6/b7/b8, b9/b10/b11, etc., are combined to form a single group. In the example illustrated here, nine groups are formed in this manner. The polarity pattern of the first group in the present example is EVEN-ODD-EVEN and that of the second group is ODD-EVEN-ODD. The uneven-numbered groups thus have the first pattern, and the even-numbered groups have the second pattern.

In the transmission of the control data 4, the polarity pattern of the different groups is selectively inverted. In the example illustrated in FIG. 7 this looks as follows:

The basic pattern of the data set is the strongly alternating polarity. If this is not changed, then a "0" is interpreted at the receiver end. In FIG. 7, for the first time, the group with the bytes b18/b19/b20 is changed. The receiver concludes from this that this group codes a "1". The probability that, due to transmission errors, all three successive bytes would have an inverted polarity is infinitesimally small. This probability can even be made 0 if the proper block coding (for example a bit interleaved parity) is used.

The subsequent group b21/b22/b23 does not have the pattern it would actually have to have in an undisturbed case. Thus it also codes a "1". The subsequent (seventh) group is the first one that is no longer modulated, and, as a result, encodes a "0".

The last two bytes b35, b36 are not modulated in the present example. They contain, for example, a monitoring bit and a column parity bit. (The above-named column parity bit can be used as a block coding to improve transmission reliability.)

The example illustrated in FIG. 7 makes it clear that it is not necessary for all parity bits of the data set to be modulated. This is especially the case when not all the bytes of a group can be assigned. In FIG. 7, the bytes b33, b34 cannot form a complete $3^{rd}$ group, and are thus not considered in the parity modulation.

The data modulation specified in the invention can be implemented practically without additional expense in terms of circuitry. The detection or demodulation is very simple and correspondingly rapid. Known-in-the-art elements can be inserted, which, in accordance with the invention, also permit control of the polarity generation of the bit parity.

Naturally, the invention is not limited to the embodiment described. Specifically, it is possible to transmit more than two different states, when the modulation is not limited to the simple inversion of the basic pattern. In that case, logically, 4'h or 5di groups are formed. It is also possible for the different patterns to have different lengths.

In summary, the invention has proven to provide a packet synchronization process that is both easy to implement and reliable.

What is claimed is:

1. A method of data transmission, wherein transmission of a synchronization cell comprises the steps of:

transmitting a synchronization bit pattern including a first error protection code; and transmitting a data set including a second error protection code, the first error protection code being different than the second error protection code.

2. The method of data transmission of claim 1, wherein at least one synchronization cell is transmitted interspersed with a plurality of data cells.

3. The method of data transmission of claim 2, wherein a majority of the data cells contain a block code for reception synchronization confirmation.

4. The method of data transmission of claim 3, wherein a block code is a bit interleaved parity value for a corresponding data cell.

5. The method of data transmission of claim 2, wherein transmission of a data cell comprises the steps of:

transmitting a header including the first error protection code; and transmitting a data set including the second error protection code.

6. The method of data transmission of claim 2, wherein the at least one synchronization cell and the plurality of data cells are of equal length.

7. The method of data transmission of claim 2, wherein the synchronization cells are transmitted interspersed with the plurality of data cells with a frequency of occurrence greater than 0.1%.

8. The method of data transmission of claim 2, wherein the synchronization cells are transmitted interspersed with the plurality of data cells with a frequency of occurrence of approximately 1%.

9. The method of data transmission of claim 1, wherein the data set of the synchronization cell contains filler data.

10. The method of data transmission of claim 1, wherein the first and second error protection codes are bit parity codes that have respectively different polarity patterns.

11. The method of data transmission of claim 1, wherein the synchronization bit pattern is transmitted within a header of the synchronization cell.

* * * * *